United States Patent [19]
Ganesan et al.

[11] Patent Number: 5,275,667
[45] Date of Patent: Jan. 4, 1994

[54] METHOD OF CHARACTERIZING THE LEVEL OF CLEANLINESS OF AN INORGANIC SURFACE

[75] Inventors: Sankaranarayanan Ganesan, Scottsdale; Shun-Meen Kuo, Chandler; Howard M. Berg, Scottsdale, all of Ariz.

[73] Assignee: Motorola, Inc., Schaumburg, Ill.

[21] Appl. No.: 878,067

[22] Filed: May 4, 1992

[51] Int. Cl.$^5$ ................................................ B08B 3/10
[52] U.S. Cl. .................................... 134/1; 134/26; 134/42
[58] Field of Search ............ 134/1, 26, 30, 42; 437/DIG. 17; 156/643

[56] References Cited

U.S. PATENT DOCUMENTS

| | | | |
|---|---|---|---|
| 3,833,842 | 9/1974 | Cunninham et al. | 437/192 |
| 4,028,135 | 6/1977 | Vig et al. | 134/1 |
| 4,885,047 | 12/1989 | Ury et al. | 134/1 |
| 5,028,560 | 6/1991 | Tsukamoto et al. | 437/946 |

FOREIGN PATENT DOCUMENTS

| | | | |
|---|---|---|---|
| 0188124 | 10/1984 | Japan | 148/DIG. 17 |
| 0212226 | 10/1985 | Japan | 134/1 |
| 0210637 | 9/1986 | Japan | 134/1 |

OTHER PUBLICATIONS

Vig et al., UV/Ozone Cleaning of Surfaces, Dec. 1976, 365-370.

Primary Examiner—R. Bruce Breneman
Assistant Examiner—Saeed T. Chaudhry
Attorney, Agent, or Firm—Miriam Jackson; Joe E. Barbee

[57] ABSTRACT

A fast and simple method of determining a desired level of cleanliness of an inorganic surface is performed by correlating a level of cleanliness of many inorganic surfaces having varying thicknesses of organic contamination with reliability tests. The level of cleanliness is in terms of a measurement from a water drop test. The level of cleanliness between two inorganic surfaces can also be compared by utilizing the combination of a UV/ozone clean and the level of cleanliness to determine the relative amount of contamination present on one inorganic surface as compared to the other.

13 Claims, 1 Drawing Sheet

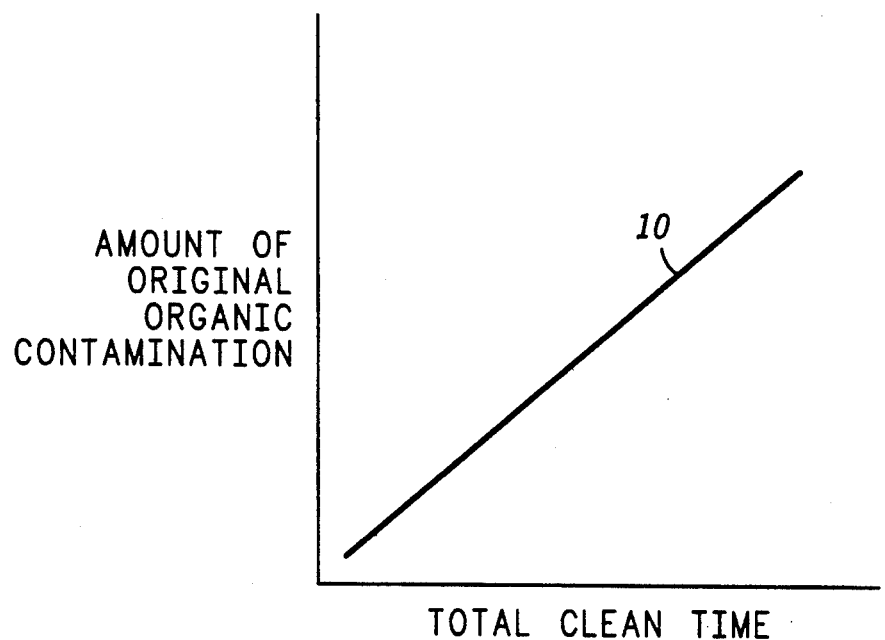

METHOD OF CHARACTERIZING THE LEVEL OF CLEANLINESS OF AN INORGANIC SURFACE

BACKGROUND OF THE INVENTION

This invention relates, in general, to a method of characterizing the level of cleanliness, including, but not limited to, a method of characterizing the amount or organic contamination on an inorganic surface.

Surface analysis methods such as Auger electron spectroscopy (AES) and X-ray photoemission spectroscopy coupled with sputter profiling have been used in the semiconductor industry to determine the thickness of organic or inorganic contaminates present on a semiconductor surface (an inorganic surface). Although AES and x-ray emission spectroscopy methods are very accurate, one drawback of using these methods is that they are costly and time consuming.

In a semiconductor manufacturing environment it would be advantageous to determine the level of cleanliness of an inorganic surface within a short period of time where it would be easy to evaluate potential improvements, rather than having to send out a sample to be tested. Thus, it would be desirable to come up with a low cost, fast method of characterizing and quantifying the thickness of organic contamination present on an inorganic surface.

SUMMARY OF THE INVENTION

A method of characterizing a level of cleanliness of an inorganic surface is comprised of, first, providing a plurality of inorganic surfaces with varying thicknesses of organic contamination thereon. Thereafter, the level of cleanliness of the plurality of inorganic surfaces is determined, wherein the level of cleanliness is in terms of a measurement from a water drop test. Then, reliability tests are performed on the plurality of inorganic surfaces. Finally, a desired level of cleanliness of the plurality of inorganic surfaces is correlated with a desired level of reliability, wherein the desired level of cleanliness is in terms of the measurement from the water drop test.

In a further embodiment, the relative thickness of organic contamination on two inorganic surfaces is determined by, first, providing a first inorganic surface having a first thickness of organic contamination thereon. The desired level of cleanliness is determined as set out above. Then, the water drop test is performed on the inorganic surface to determine the level of cleanliness of the inorganic surface, wherein the level of cleanliness is in terms of the measurement from the water drop test. Thereafter, a UV/ozone clean of the first inorganic surface is performed for a first incremental time. The steps of performing the water drop test and performing a UV/ozone clean are repeated until at least the desired level of cleanliness is obtained. Then, a second inorganic surface having a second thickness of organic contamination thereon is provided. The water drop test is performed on the second inorganic surface to determine the level of cleanliness of the second inorganic surface, wherein the level of cleanliness is in terms of the measurement from the water drop test. Thereafter, a UV/ozone clean of the second inorganic surface is performed for a second incremental time. The steps of performing the water drop test on the second inorganic surface and performing a UV/ozone clean of the second inorganic surface are repeated until the desired level of cleanliness is obtained. Then, a first total time is obtained by adding up the first incremental times. A second total time is obtained by adding up the second incremental times. Then, the first total time is compared with the second total time to determine the relative amount of the second thickness of contamination cleaned from the second inorganic surface as compared to the first thickness of contamination cleaned from the first inorganic surface.

BRIEF DESCRIPTION OF THE DRAWING

The single FIGURE illustrates a graph used in one embodiment of the present invention.

DETAILED DESCRIPTION OF THE PREFERRED EMBODIMENTS

A fast and simple method of characterizing a level of cleanliness of an inorganic surface is accomplished. The amount of organic contamination present on an inorganic surface is determined and related to reliability. First, from prior studies, a desired level of cleanliness of the inorganic surface is determined. For example, the inorganic surface can be a part of an object used to make semiconductor products, including, a semiconductor wafer, chip or leadframe at a particular stage of processing of which the level of cleanliness is to be characterized. The level of cleanliness is in terms of a measurement from a water drop test. Hereinafter, when the "level of cleanliness" is referred to, it will always be in terms of a measurement from a water drop test, unless otherwise specified.

There are two equivalent measurements that can be used from the water drop test. The first is a measurement of the contact angle of a water droplet to the inorganic surface using, for example, a contact-angle goniometer. Contact angle measurements measure the angle between the tangent to the water/air interface at the water/air/inorganic surface triple point and the inorganic surface. The contact angle gets smaller as the amount of organic contamination present on the inorganic surface is less.

The second is a measurement of the diameter of a water droplet (of a fixed volume of water) on an inorganic surface. The diameter of the water droplet varies according to the level of cleanliness on the inorganic surface. In fact it is even possible to use a less accurate version of the test by only noting, with the human eye, how large the water droplet is. The diameter of the water droplet is inversely related to the contact angle and gets larger as the amount of contamination is less.

In a preferred embodiment, the contact angle measurement would be used because of its greater quantitative accuracy, however, in certain cases, it may be desirable to use the measurement of the diameter of the water droplet because it is simpler than measuring the contact angle. For the purposes of this invention, it was found that both the contact angle measurements and measurement of the water droplet diameter provided enough accuracy.

A preferred way to determine the desired level of cleanliness, a plurality of inorganic surfaces with varying amounts of organic contamination thereon are provided. The level of cleanliness of the plurality of inorganic surfaces is then determined. Reliability tests are then performed on the plurality of inorganic surfaces. The type of reliability tests performed would depend on the type of surface to be tested. The desired level of cleanliness is determined by correlating which value or range of levels of cleanliness has a desired level of reliability. The desired level of cleanliness may also be determined in other suitable ways.

In this manner, the inorganic surfaces which are processed thereafter may be tested to see if they at least meet the desired level of cleanliness. This test can be readily performed in the manufacturing area. Further cleaning can be performed on the inorganic surfaces that do not meet the desired level of cleanliness.

The present invention can be carried out further to characterize the relative level of cleanliness between two inorganic surfaces. Once the desired level of cleanliness is determined, a first inorganic surface is then provided having a first amount of organic contamination thereon. The level of cleanliness of the first inorganic surface is then determined. If the level of cleanliness of the first inorganic surface is not less than or equal to the desired level of cleanliness, then an incremental UV/ozone clean of the inorganic surface is performed for a specific amount of time. When the level of cleanliness is less than the desired level of cleanliness, then the inorganic surface is not as clean as desired. UV/ozone cleaning removes all organic contamination from an inorganic surface. The specific amount of time the incremental UV/ozone clean is performed depends on the measurement obtained from the water drop test. Typically, this incremental time can range from 5 seconds to 2 minutes, depending on the UV/ozone clean process used.

The process of UV/ozone cleaning inorganic surfaces, in particular semiconductor wafers or leadframes is described in a pending application, entitled Crack Resistant Semiconductor Package and Method for Making, by Berg et al., having a U.S. Ser. No. 07/790,845. For the purposes of this invention it is only necessary to recognize and utilize the fact that the amount of organic contamination removed is linearly related to the amount of time the Uv/ozone clean is performed.

The steps of performing the incremental UV/ozone clean and determining the level of cleanliness are repeated until the desired level of cleanliness is obtained. A first total time is obtained by adding up the incremental UV/ozone cleaning times performed on the first inorganic surface.

The above steps represent characterizing a particular process. It is desirable to see what the impact is on the contamination present on the inorganic surface if the process is changed in some way. To determine this, a second inorganic surface having a second thickness of organic contamination thereon is provided. The same steps are carried out as above with respect to the first inorganic surface, except that a second total time that the second inorganic surface is cleaned would be calculated.

The first total time is then compared to the second total time. From this comparison, the relative amount of the second amount of contamination cleaned from the second inorganic surface as compared to the first amount of contamination cleaned from the first inorganic surface can be determined. In other words, if the first total amount of time is twice as long as the second total amount of time, the second amount of contamination is half as much as the first amount of contamination. This can be done because of the linear relationship between UV/ozone clean time and amount of contamination removed.

The quantitative amount of contamination present on an inorganic surface can also be determined. The steps as carried out above are performed. Then, a correlation graph of specific UV/ozone cleaning times of the inorganic surface necessary to obtain at least the desired level of cleanliness versus known amounts of organic contamination present on the inorganic surface determined from a quantitative test is provided. This correlation graph can be easily plotted by preparing samples of the inorganic surface with varying amounts of organic contamination. The varying amounts of contamination are then quantized using a quantitative test such as AES. Other quantitative tests may be used.

Then, the level of cleanliness is determined and UV/ozone cleaning is performed until the desired level of cleanliness is at least obtained for each sample. The total amount of cleaning time required to obtain at least the desired level of cleanliness for each sample versus the known amounts of original contamination present on each sample is then plotted, as shown in the highly simplified FIGURE. Clean time may be plotted in minutes or seconds. The original amount or thickness of contamination may be conveniently plotted in Angstroms. The FIGURE illustrates only a schematic of one example of the plot which may be obtained. Note that a line 10 illustrates the linear relationship between total clean time and amount of contamination. By knowing the second total UV/ozone clean time, the corresponding quantitative amount of organic contamination that was cleaned from the second inorganic surface can be read from the correlation graph.

As can bee seen, the level of cleanliness of an inorganic surface can be determined within a short period of time, directly in the manufacturing area. The present invention allows for a low cost, fast method of characterizing and quantifying the thickness of organic contamination present on an inorganic surface.

We claim:

1. A method of characterizing a level of cleanliness of an inorganic surface, comprising the steps of:
    a) providing a first inorganic surface having a first thickness of organic contamination thereon;
    b) determining a desired level of cleanliness of the first inorganic surface, wherein the desired level of cleanliness is in terms of the measurement from a water drop test;
    c) determining a level of cleanliness of the first inorganic surface, wherein the level of cleanliness is in terms of the measurement from the water drop test;
    d) performing a UV/ozone clean of the first inorganic surface for a first incremental time if the level of cleanliness is less than or equal to the desired level of cleanliness;
    e) repeating steps c) and d) until at least the desired level of cleanliness is obtained;
    f) obtaining a first total time by adding up the first incremental times the UV/ozone clean of the first inorganic surface is performed to obtain at least the desired level of cleanliness;
    g) providing a correlation graph of specific UV/ozone cleaning times of the inorganic surface necessary to obtain at least the desired level of cleanliness versus known thicknesses of organic contamination present on the inorganic surface, wherein the known thicknesses are determined from a quantitative test; and
    h) using the correlation graph and the first total time to determine the quantitative amount of the first amount of organic contamination cleaned from the inorganic surface.

2. The method of claim 1 wherein steps b) and c) comprises measuring the contact angle of a water droplet on the first inorganic surface.

3. The method of claim 1 wherein steps b) and c) comprises utilizing the diameter of a water droplet on the first inorganic surface.

4. The method of claim 1 wherein step a) comprises providing a semiconductor wafer.

5. A method of characterizing a level of cleanliness of an inorganic surface, comprising the steps of:
   a) providing a first inorganic surface having a first thickness of organic contamination thereon;
   b) determining a desired level of cleanliness of the inorganic surface, wherein the desired level of cleanliness is in terms of the measurement from the water drop test;
   c) determining a level of cleanliness of the first inorganic surface, wherein the level of cleanliness is in terms of the measurement from the water drop test;
   d) performing a UV/ozone clean of the first inorganic surface for a first incremental time if the level of cleanliness is less than or equal to the desired level of cleanliness;
   e) repeating steps c) and d) until at least the desired level of cleanliness is obtained;
   f) providing a second inorganic surface having a second thickness of organic contamination thereon;
   g) determining the level of cleanliness of the second inorganic surface, wherein the level of cleanliness is in terms of the measurement from the water drop test;
   h) performing the UV/ozone clean of the second inorganic surface for a second incremental time if the level of cleanliness is less than or equal to the desired level of cleanliness; and
   i) repeating steps g) and h) until at least the desired level of cleanliness is obtained;
   j) obtaining a first total time by adding up the first incremental times the UV/ozone clean of the first inorganic surface is performed to obtain at least the desired level of cleanliness;
   k) obtaining a second total time by adding up the second incremental times the UV/ozone clean of the second inorganic surface is performed to obtain at least the desired level of cleanliness; and
   l) comparing the first total time with the second total time to determine the relative amount of the second amount of contamination cleaned from the second inorganic surface as compared to the first amount of contamination cleaned from the first inorganic surface.

6. The method of claim 5 further comprising the steps of:
   m) providing a correlation graph of specific UV/ozone cleaning times of the inorganic surface necessary to obtain at least the desired level of cleanliness versus known thicknesses of organic contamination present on the inorganic surface, wherein the known thicknesses are determined from a quantitative test; and
   n) determining the quantitative amount of the second amount of organic contamination cleaned from the inorganic surface by using the correlation graph and the second total time.

7. The method of claim 5 wherein steps b) and c) and g) comprises measuring the contact angle of a water droplet on the first and the second inorganic surfaces.

8. The method of claim 5 wherein steps b) and c) and g) comprises utilizing the diameter of a water droplet on the first and the second inorganic surfaces.

9. The method of claim 5 wherein steps a) and f) comprises providing a first and a second semiconductor wafer having a first and a second thickness of organic contamination, respectively, thereon.

10. A method of characterizing a level of cleanliness of an inorganic surface, comprising the steps of:
    a) providing a first inorganic surface having a first thickness of organic contamination thereon;
    b) determining a desired level of cleanliness of the inorganic surface, wherein the desired level of cleanliness is in terms of the measurement from the water drop test;
    c) determining a level of cleanliness of the first inorganic surface, wherein the level of cleanliness is in terms of the measurement from the water drop test;
    d) performing a UV/ozone clean of the first inorganic surface for a first incremental time if the level of cleanliness is less than or equal to the desired level of cleanliness;
    e) repeating steps c) and d) until at least the desired level of cleanliness is obtained;
    f) providing a second inorganic surface having a second thickness of organic contamination thereon;
    g) determining the level of cleanliness of the second inorganic surface, wherein the level of cleanliness is in terms of the measurement from the water drop test;
    h) performing the UV/ozone clean of the second inorganic surface for a second incremental time if the level of cleanliness is less than or equal to the desired level of cleanliness; and
    i) repeating steps g) and h) until at least the desired level of cleanliness is obtained;
    j) obtaining a first total time by adding up the first incremental times the UV/ozone clean of the first inorganic surface is performed to obtain at least the desired level of cleanliness;
    k) obtaining a second total time by adding up the second incremental times the UV/ozone clean of the second inorganic surface is performed to obtain at least the desired level of cleanliness; and
    l) determining the relative amount of the second amount of contamination cleaned from the second inorganic surface as compared to the first amount of contamination cleaned from the first inorganic surface by comparing the first total time with the second total time.

11. The method of claim 10 wherein steps b) and c) and g) comprises measuring the contact angle of a water droplet on the first and the second inorganic surfaces.

12. The method of claim 10 wherein steps b) and c) and g) comprises utilizing the diameter of a water droplet on the first and the second inorganic surfaces.

13. The method of claim 10 wherein steps a) and f) comprises providing a first and a second semiconductor wafer having a first and a second thickness of organic contamination, respectively, thereon.

* * * * *